United States Patent [19]

Roes

[11] Patent Number: 5,360,941

[45] Date of Patent: Nov. 1, 1994

[54] MAGNETICALLY PERMEABLE ELECTROSTATIC SHIELD

[75] Inventor: John B. Roes, San Diego, Calif.

[73] Assignee: Cubic Automatic Revenue Collection Group, San Diego, Calif.

[21] Appl. No.: 784,457

[22] Filed: Oct. 28, 1991

[51] Int. Cl.$^5$ .............................. H05K 9/00
[52] U.S. Cl. .................. 174/35 R; 361/816; 428/621
[58] Field of Search ............ 174/35 R, 35 MS; 361/424; 219/10.55 R, 10.55 D; 428/35.8, 621

[56] References Cited

U.S. PATENT DOCUMENTS

| | | | |
|---|---|---|---|
| 2,288,735 | 7/1942 | O'Connell | 174/35 MS |
| 2,296,452 | 9/1942 | Rust . | |
| 3,479,622 | 11/1969 | Freer | 334/85 |
| 3,563,575 | 1/1986 | Hoppe et al. | 235/492 |
| 4,262,365 | 4/1981 | George | 455/603 |
| 4,327,124 | 4/1982 | DesMarais, Jr. . | |
| 4,452,076 | 9/1985 | Bednarz et al. | 428/624 |
| 4,500,408 | 2/1985 | Boys et al. . | |
| 4,508,755 | 4/1985 | Reintjes et al. . | |
| 4,591,945 | 5/1986 | Ugon | 361/212 |
| 4,663,240 | 5/1987 | Hajdu et al. | 428/545 |
| 4,818,855 | 4/1989 | Mongeon et al. | 235/440 |
| 4,851,608 | 7/1989 | Seip | 174/35 |
| 4,899,036 | 2/1990 | McCrindle et al. | 235/380 |
| 4,913,789 | 4/1990 | Aung . | |
| 5,110,643 | 5/1992 | Akao et al. | 428/35.9 |

FOREIGN PATENT DOCUMENTS 0347321 12/1989 European Pat. Off. .

Primary Examiner—Leo P. Picard
Assistant Examiner—Bot Ledynh
Attorney, Agent, or Firm—Brown, Martin, Haller & McClain

[57] ABSTRACT

A permeable electrostatic shielding method and apparatus is disclosed that is suitable for use in shielding portable electronic devices such as calculators, smart cards and radios. Such electronic devices require protection from the electrostatic discharge occurring when a user accumulates an electrostatic charge and contacts a conducting surface of the electronic device. The resulting electrostatic discharge creates capacitively-coupled voltage transients in the digital circuits within the electronic device. The present invention prevents local charge accumulation on the surfaces of such electronic devices, which transmit and receive electromagnetic radio waves, without blocking the electromagnetic radiation essential to device function. One embodiment of this permeable electrostatic shield is formed by depositing a conductive layer of controlled thickness comprising a plurality of closely-spaced conductors that are electrically connected at one end to form a practical electrostatic shield permeable to RF electromagnetic radiation above 15 MHz.

14 Claims, 2 Drawing Sheets

MAGNETICALLY PERMEABLE ELECTROSTATIC SHIELD

BACKGROUND OF THE INVENTION

1. Field of the Invention

My invention involves generally methods for radio frequency (RF), electromagnetic interference (EMI) and electrostatic shielding and, more specifically, involves methods for blocking electrostatic fields without blocking RF magnetic fields.

2. Description of the Related Art

Electrostatic discharge is defined in the U.S. Military Handbook DOD-HKBK-263 as a "transfer of electrostatic charges between bodies at different potentials caused by direct contact or induced by an electrostatic field." This transfer of electrostatic charge causes destruction to electronic components, which are increasingly susceptible to such destruction. Electrostatic discharge (ESD) is the primary source of damage to and failures of semiconductor devices today.

Most ESD related efforts have been by practitioners in the microcircuit manufacturing arts and involve the prevention of electrostatic charge accumulation by a variety of means. Relatively little effort goes into hardening the modern electronic microcircuit device against the effects of ESD. Considerable confusion and misunderstanding of electrostatic electricity exist in the microcircuit manufacturing industry because of this prevailing emphasis on electrostatic control products. Most electrostatic control products operate to reduce or eliminate the accumulation of electrostatic charges through grounding or ionization. Personnel-generated electrostatic charge is commonly controlled with a wrist strap that works as intended but does not completely control the problem because it protects only at the workstation and does not remove accumulated electrostatic charge from clothing. Personnel approaching a workstation can carry potentially damaging electrostatic charges until a wrist strap is attached.

The accumulation of static electricity occurs freely in nature. In factories with nonconductive floors and no means of humidity control, a worker merely walking across the floor can accumulate an electrostatic charge because of the triboelectric effect known in the art. With humidity under 20%, the triboelectric effect causes electrostatic charge accumulation merely from the repeated making and breaking of contact between a worker's shoes and the floor.

As a worker approaches a static-sensitive device at a workstation, the worker's accumulated electrostatic field reaches the device ahead of the worker and induces a current sufficient to damage or destroy. As the worker arrives at the workstation, the electrostatic field is now close enough to polarize the sensitive devices so that damage can again result without the devices having been touched. Then, if the worker reaches out to pick up a device, an electrostatic discharge (ESD) jumps from fingertip to device, creating an electromagnetic pulse (EMP) that can damage all nearby devices by inducing destructive currents. Practitioners in the art believe that as much as 25% of all electronic component failures are caused by ESD.

Because electrostatic charge on one body can be imparted to another body through induction and conduction, ESD damage can result from unsuspected sources. Electron transfer will occur when two contacting bodies are rubbed together, separated, or flow past one another. These physical facts demonstrate that the accumulation of electrostatic charges cannot be prevented or eliminated but only controlled. Moreover, because electrostatic charges and discharges occur everywhere, the effects of such charges on sensitive electronic components cannot be eliminated through elimination of the charge itself, but must be prevented through shielding of devices from the damaging effects of accumulated electrostatic charges.

Common methods for protecting sensitive electronic components from the effects of accumulated electrostatic charges include the use of antistatic and conductive packaging materials. Antistatic packaging materials are produced by adding an organic antistatic additive to a plastic base material to form a hygroscopic plastic. Antistatic materials do not act as shields but instead function by forming a conductive moisture layer that minimizes the accumulation of electrostatic charge and tends to equalize the charge over the entire package surface. Conductive materials, while not retarding electrostatic charge accumulation, do provide shielding and also equalize the charge over the packaging surface and allow rapid charge dissipation when grounded. Conductive packaging materials can be produced by depositing continuous metal layers onto a base layer or coating a base layer with conductive paints or carbon-loaded conductive ink.

Antistatic bags using polyethylene sheet material folded at the bottom and sealed on the side are widely used as containers for sensitive components. Such a bag comprises a humidity-independent conductive outer layer, a middle insulation layer, and a humidity-dependent antistatic inner layer and can be transparent to permit examination of components without removal from the bag. Variations on this antistatic bag concept include bags comprising layers of aluminum or nickel foil, carbon-loaded plastic, and other similar materials known in the art.

Conductive boxes and enclosures using materials similar to those employed in these bags will also protect sensitive electronic components from the effects of accumulated electrostatic charges. An outer conductive metal or carbon-loaded plastic layer can serve as an excellent Faraday shield, which shields the contents from both electrostatic charges and electromagnetic radiation or pulses.

Practitioners in the art have responded to the need for electrostatic shielding by developing a variety of means for shielding sensitive components. For instance, U.S. Pat. No. 4,542,076, issued to Jurgen Bednarz, et al., on Sep. 17, 1985, discloses a method for metallizing plastic by roughening the plastic surface, plating the surface with metal, and adding an outer coating to hold the metal in place. Bednarz's method is suitable for metallizing plastic shrink wrap for use in shielding cable connectors and the like. The metallized plastic is nonpermeable to electromagnetic radiation.

U.S. Pat. No. 4,663,240, issued to Juan Hajdu, et al., on May 5, 1987, discloses a method for coating plastic enclosures with two layers of a special metallized paint to form a 40 dB radio frequency (RF) electromagnetic shield. Hajdu does not consider the problem of electrostatic shielding.

U.S. Pat. No. 4,851,608, issued to Donald P. Seip, on Jul. 25, 1989, discloses a method for manufacturing honeycomb shields for covering enclosure openings for cooling fans and the like. Seip addresses the problem of air-permeable electromagnetic shields but does not consider the electrostatic shielding problem. Similarly, U.S. Pat. No. 4,262,365, issued to John B. George, on Apr. 14, 1981, discloses a thin metal RF electromagnetic shield with slots and louvers disposed to transmit and scatter infrared radiation (IR) while shielding against electromagnetic radiation. George's IR permeable shield does not relate to the electrostatic shielding problem.

U.S. Pat. No. 3,479,622, issued to W. Freer, on Nov. 18, 1969, discloses a radio frequency tuner having two sections separated by an iris window with a plurality of conductive fingers extending across the window. This window and finger arrangement acts as a high-pass filter that blocks low frequency electrostatic fields while remaining transparent to high frequency electromagnetic fields. Freer neither teaches nor suggests the application of his low pass filter technique to the protection of sensitive electronic components.

None of these techniques are useful for the protection of portable electronic devices such as calculators, smart cards and radios, which require protection from accumulated electrostatic charges and ESDs that occur when a charged user handles the device or contacts a nearby conductive surface. The shielded bag and box used in microcircuit manufacturing, while providing good protection from ESD, also block the transmission of electromagnetic energy necessary for the proper operation of many portable electronic devices. The typical wrist strap and antistatic container techniques are practical only during a manufacturing or assembly process. The casual user of a portable electronic device will have neither wrist strap grounding nor special antistatic shoes.

When exposed to ESD, a typical electronic device experiences rapid changes in capacitively-coupled voltage at the input of the microcircuit components, often sufficient to cause device malfunction if not destruction. The best method for shielding against these effects is the use of a grounded conductive metal surface as is known in the art. A plastic surface filled with conductive particles is less effective because capacitive-coupling of the rapid ESD transients is still possible. Thus, the only effective electrostatic shielding means known in the art are those metal surfaces that also block the transmission of electromagnetic radiation.

There is a strongly-felt need in the art for an electrostatic shield that protects against ESD and can be used with portable electronic devices such as calculators, smart cards and radios without preventing the transmission of the RF electromagnetic fields required for proper function. This need is acute for devices that use radio frequencies above 15 MHz because of the bandwidth requirements of modern micro-technology. These unresolved problems and deficiencies are clearly felt in the art and are solved by my invention in the manner described below.

SUMMARY OF THE INVENTION

I have discovered that when a metal electrostatic shield comprises an excellent conductor such as copper, brass or aluminum, then I can use a metal layer of 10–20 nanometers in thickness to effectively shield against electrostatic discharge while still permitting the penetration and transmission of a radio-frequency (RF) magnetic field. The general rule that I have discovered for making such a metal shield is that the thickness of the metal layer must be 10–20% of the skin penetration depth for the particular metal and frequency involved. I have found this method to be practical for frequencies below 10–15 MHz. Above this frequency range, the metal layer thickness must be so thin that the low cross-sectional conductivity degrades the electrostatic shielding effectiveness unacceptably.

In my work with thin continuous metal shields for use in shielding sensitive electronic components against the effects of electrostatic field accumulation and discharge, I have also discovered that the use of a multiplicity of closely-spaced conductors that are electrically connected at one end to form a Faraday comb shield can effectively protect sensitive electronic components against ESD without excluding the RF electromagnetic fields above 15 MHz.

Both my thin continuous metal shield and my Faraday comb shield can easily be fabricated using sputtering techniques to deposit the high conductivity metal onto a polyester supporting surface in a manner known in the art for making sunscreens for office windows. Alternatively, my Faraday comb shield can be deposited by printing or silk screen techniques using conductive ink. It may also be laminated by cementing pre-cut patterns of metal foil to a nonconductive surface.

My shielding technique is useful in forming rigid boxes and containers as well as flexible bags and wrapping materials. A metal Faraday comb shield can be deposited or printed on the inside surface of the existing plastic case used for a portable radio or calculator, for instance, or a MYLAR ® sheet having a 20 nm deposition of copper can be wrapped around a smart card circuit, for example. I have applied my invention to the shielding of a smart fare card design disclosed in co-pending patent application No. 07784,456 filed Oct. 28, 1991 entitled "NON-CONTACT AUTOMATIC FARE COLLECTION SYSTEM" (now abandoned) (filed as a continuation-in-part of the parent Application No. 07/490,998 filed on Mar. 9, 1990).

The foregoing together with other features and advantages of my invention, will become more apparent when referring to the following specifications, claims and the accompanying drawings.

BRIEF DESCRIPTION OF THE DRAWINGS

For a more complete understanding of my invention, reference is now made to the following detailed description of the embodiments illustrated in the accompanying drawings, wherein.

DESCRIPTION OF THE PREFERRED EMBODIMENTS

Figure 1A:
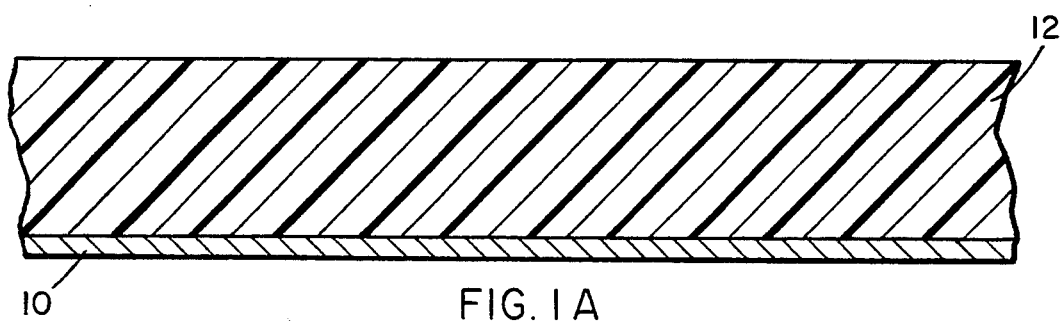
FIG. 1A is a cross-sectional view of part of a magnetically permeable shield according to one embodiment of the invention.
Figure 1B:
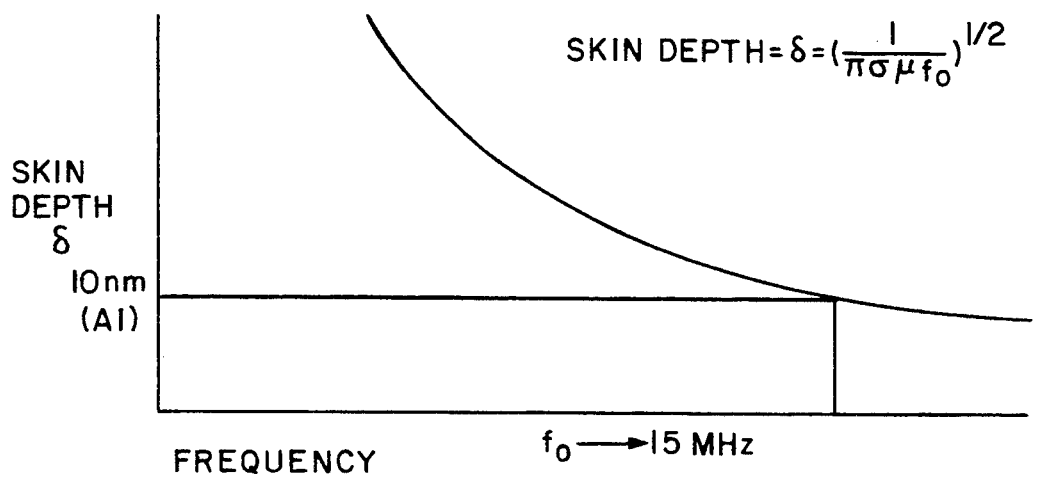
FIG. 1B is a graph illustrating the variation of skin penetration depth with frequency.

FIG. 1A illustrates a continuous conductive shielding layer 10 according to one embodiment of the present invention, while FIG. 1B illustrates graphically the mathematical relationship between the skin depth of the relationship between minimal thickness of a continuous conductive metal shielding layer and the frequency above which the continuous conductive shielding layer becomes substantially opaque to electromagnetic energy as well as electrostatic energy. Skin depth is defined as the thickness at which RF attenuation is 1/e, or 36.6% of input, for a particular frequency. Thus, FIG. 1B illustrates the variation of skin depth or as a function of frequency for a particular material. A continuous conductive layer 10 is shown deposited by any suitable means known in the art onto a flexible supporting surface 12. Surface 12 may be flexible or rigid but must be substantially nonconducting relative to shielding layer 10. Typically, supporting surface 12 comprises a 25,000 nm thick layer of MYLAR ® or other suitable material such as an aromatic polyamide, a polyester or a polyethylene.

FIG. 1B also shows the mathematical formula relating skin depth $\delta$ to frequency, $f_0$. This relationship is governed by the bulk conductivity a and bulk permeability $\mu$ of the metal comprising conductive shielding layer 10. The thickness of conductive shielding layer 10 should be no more than 20%, preferably 10%, of the skin depth $\delta$ for the metal. The frequency f0 is the frequency above which conductive shielding layer 10 becomes substantially opaque to alternating magnetic fields. That is, shield layer 10 will be permeable to magnetic fields at frequencies below $f_0$ but, because of the high conductivity $\sigma$, of shield layer 10, it will be impervious to electrostatic fields. To ensure the necessary high value of conductivity $\sigma$, conductive shield layer 10 should comprise highly conductive metals such as copper, silver, aluminum, gold and zinc. To ensure a reasonably high value of frequency $f_0$, metals having high permittivity $\mu$, such as nickel and iron, should be avoided.

When frequency $f_0$ must exceed 10–15 MHz, the requisite thickness of shield layer 10 becomes too small for practical electrostatic shielding. Also, because the thickness of shield layer 10 drops below 10 nm at these frequencies, the metal coating becomes too fragile for reliable application to flexible plastic supporting surfaces.

Figure 2A:
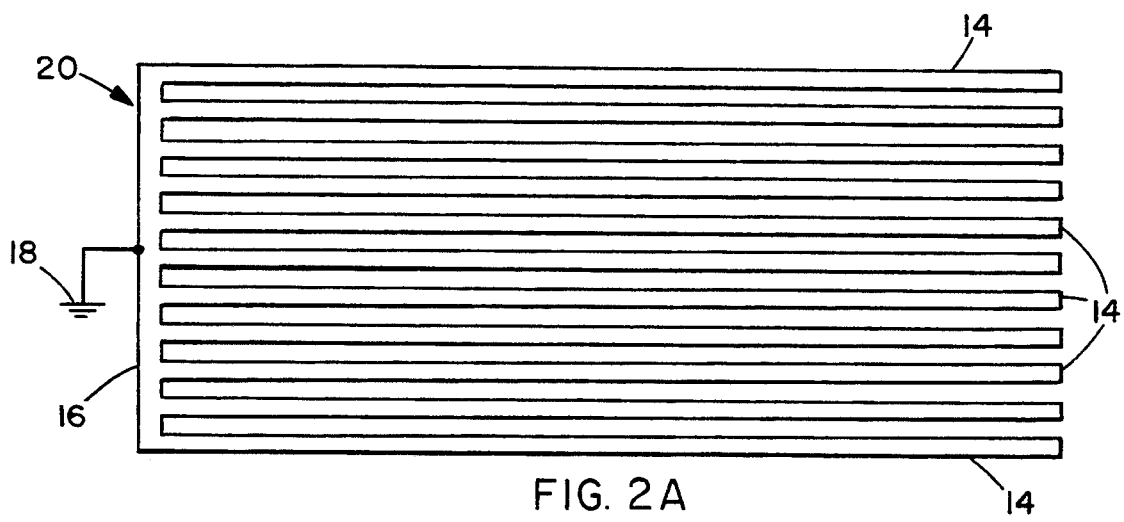
FIG. 2 illustrates the Faraday comb shield pattern suitable for magnetic field permeability above the skin depth.

In FIG. 2, I disclosed an alternative embodiment of my electrostatic shielding invention that can be made permeable to magnetic fields having frequencies above 15 MHz by selection of parameters. Although FIG. 2A shows a simple Faraday comb pattern, other suitable patterns such as those illustrated in FIG. 3 may also be used to similar effect. In FIG. 2A, a plurality of parallel conductive strips 14 is shown connected together at conductive termination 16 at one end of the pattern. Termination 16 is conductively connected to local ground potential. The spacing between parallel conductive strips 14 is illustrated as uniform but need not be uniform and may vary, provided that no space is sufficiently wide to permit ESD to couple through shield 20.

Figure 2B:
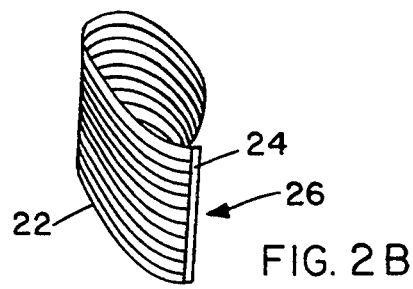
Figure 3A:
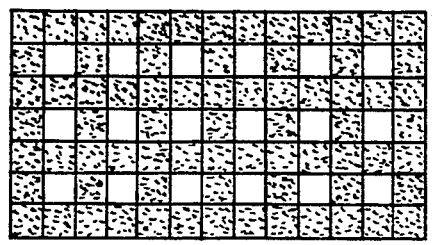
FIG. 3 shows two alternative shield pattern embodiments permeable to alternating magnetic fields above the skin depth.
Figure 3B:
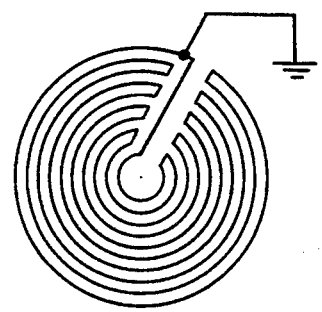

Although the Faraday comb shield is known in the art, the prior art teaches the use of such a shield for shielding both electrostatic and electromagnetic radiation entirely. My application of the Faraday comb shield pattern is unknown in the prior art because I exploit the permeability of my comb shield to alternating magnetic fields at frequencies above the usual skin depth cutoff frequency $f_0$ for the metal layer thickness used in fabricating the comb shield pattern shown in FIG. 2A. Also shown in FIG. 2B is a pouch-like container formed by folding flexible conductive shield 20 into a pattern and joining at seam 22 and overlap 24 as shown. Faraday comb shield elements 14 can lay horizontally as shown or in any other direction on pouch 26. Pouch 26 is useful for the electrostatic shielding of active electronic components requiring a magnetic permeability of pouch 26 for proper operation.

Figure 4:
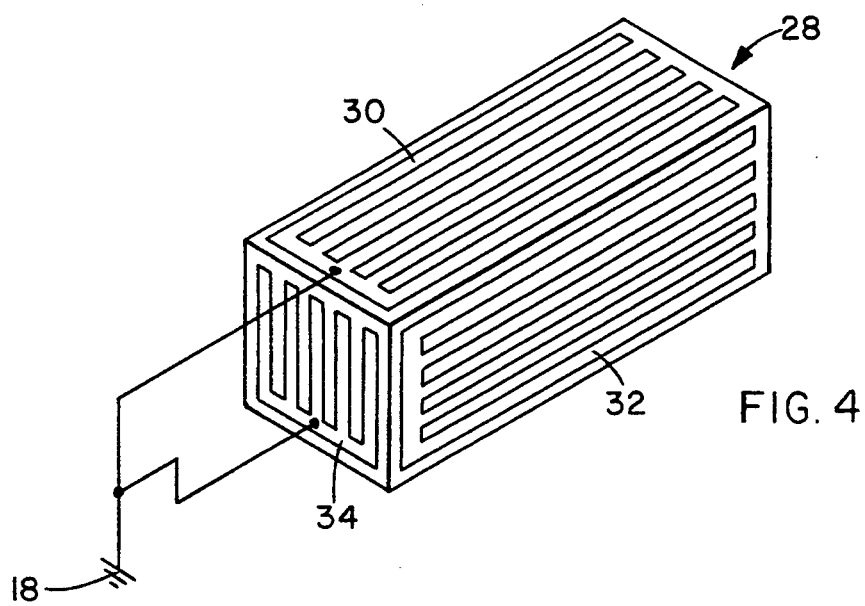
FIG. 4 illustrates a typical shielded container for an electronic device having a plurality of rigid walls comprising Faraday comb shields.

FIG. 4 shows a generic shielded container 28 having conductive shield layers on all sides with the layers 30, 32 and 34 visible. Layers 30, 32 and 34 are illustrated having the Faraday comb configurations but may as well use the patterns illustrated in FIG. 3 or the solid conductive shield layers illustrated in FIG. 1 for the appropriate skin depth cutoff frequency values. Conductive patterns used for the embodiment in FIG. 4 can be placed on the container walls in any suitable manner including sputter deposition, silk screen printing using conductive ink, lamination using adhesive and metal foil or any other useful technique known in the art. The conductive terminations of all six shield surfaces in container 28 are conductively connected to a suitable local ground 18. The contents of container 28 will be completely shielded from the effects of electrostatic potential accumulations and discharges while being receptive to alternating magnetic fields at frequencies below the effective skin depth cutoff frequency $f_0$ for the material thickness selected. The strip spacing and material selection will affect the effective skin depth cutoff frequency $f_0$ in the following manner. The cutoff frequency $f_0$ will increase with decreasing thickness of the conductive layers making up the parallel strips and $f_0$ will decrease with increasing spacing between conductive strips. The designer must be cautious to avoid increasing the inter-strip spacing beyond the point where box 28 will become permeable to ESD radiation as well as magnetic fields.

Figure 5A:
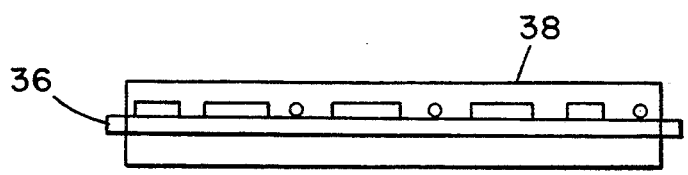
FIG. 5A is a side elevational view of a representative flexible wrapper shield wrapped around a circuit board.
Figure 5B:
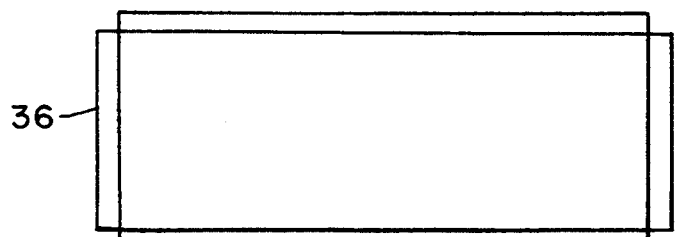
FIG. 5B is a plan view of the flexible wrapper shield and circuit board of FIG. 5A.
Figure 5C:
FIG. 5C is an end view of the flexible wrapper shield and circuit board of FIGS. 5A and 5B.

FIG. 5 shows a second typical application for my invention. A printed circuit board (PCB) 36 is shown wrapped in a shield wrapper 38 comprising substantially MYLAR ® supporting surface 12 and conductive metal shield layer 10 shown in FIG. 1. Metal layer 10 is deposited on surface 12 by a sputter deposition technique to a thickness of approximately 20 nm. The resulting 25 $\mu$m thick shield wrapper 38 is then wrapped tightly around PCB 36 and sealed in place by any suitable means. Note that shield 38 need not extend beyond the ends of PCB 36 to provide the sufficient protection against electrostatic accumulation and discharge. This is because the flat geometry of PCB 36 requires only a narrow gap between the upper and lower layers of shield wrapper 38 at the ends of PCB 36, thereby preventing substantial intrusion by electrostatic fields.

Obviously, other embodiments and modifications of my invention will occur readily to those of ordinary skill in the art in view of these teachings. Therefore, my invention will be limited only by the following claims, which include all such obvious embodiments and modifications when viewed in conjunction with the above specification and accompanying drawings.

I claim:

1. A magnetically permeable, electrostatically shielded device, comprising:
   an electronic device;
   a pouch-like container enclosing said electronic device;
   the container comprising a non-conductive supporting surface of flexible material having a conductive shielding layer, said layer consisting essentially of at least one plurality of parallel conductive strips, each said strip having a first and a second end, with said first ends conductively joined to a conductive termination; and
   said supporting surface being folded over upon itself and joined at the edges to form a pouch-like container.

2. The shielded device described in claim 1 wherein said supporting surface comprises at least one material selected from a group consisting essentially of aromatic polyamide, polyester, and polyethylene.

3. The shielded device described in claim 1 wherein said shielding layer comprises at least one material selected from a group consisting essentially of copper, silver, zinc, aluminum and gold.

4. The shielded device described in claim 1 wherein said conductive termination is conductively connected to a local ground potential.

5. The shielded device described in claim 1 wherein the spacing between said parallel conductive strips is uniform.

6. A magnetically permeable, electrostatically shielded device comprising an electronic device, an outer housing enclosing said device, said housing comprising a plurality of supporting walls joined together to form a box-like enclosure, each said wall having a non-conductive supporting surface and a conductive shielding layer consisting essentially of at least one plurality of parallel conductive strips, each said strip having a first and a second end, with said first end conductively joined to a conductive termination.

7. The shielded device described in claim 6 wherein each said conductive termination is conductively connected to a local ground potential.

8. The shielded device described in claim 6 wherein the spacing between said parallel conductive strips is uniform.

9. An electrostatically shielded device, permeable to electromagnetic radiation at a selected frequency, comprising:
   an electronic device;
   an outer container enclosing said electronic device;
   the outer container comprising a single non-conductive supporting surface having a conductive shielding layer, said shielding layer consisting essentially of a continuous surface of conductive material, said conductive material having an electromagnetic skin penetration depth at said selected frequency, and said shielding layer having a thickness of less than the electromagnetic skin penetration depth for said material at said frequency;
   the shielding layer comprising means for shielding against electrostatic discharge while permitting transmission of electromagnetic radiation at said selected frequency.

10. The shielded device described in claim 9 wherein said supporting surface is flexible.

11. The shielded device described in claim 10 wherein said supporting surface comprises at least one material selected from a group consisting essentially of aromatic polyamide, polyester, and polyethylene.

12. The shielded device described in claim 9 wherein said conductive material comprises at least one material selected from a group consisting essentially of copper, silver, zinc, aluminum and gold.

13. The device as claimed in claim 9, wherein the shielding layer has a thickness of less than 20% of the skin penetration depth.

14. The device as claimed in claim 13, wherein the shielding layer has a thickness of 10% of the skin penetration depth.

* * * * *